(12) United States Patent
Plants

(10) Patent No.: US 6,990,010 B1
(45) Date of Patent: Jan. 24, 2006

(54) DEGLITCHING CIRCUITS FOR A RADIATION-HARDENED STATIC RANDOM ACCESS MEMORY BASED PROGRAMMABLE ARCHITECTURE

(75) Inventor: William C. Plants, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 126 days.

(21) Appl. No.: 10/636,346

(22) Filed: Aug. 6, 2003

(51) Int. Cl.
*G11C 11/00* (2006.01)

(52) U.S. Cl. .................................. 365/154; 365/189.01
(58) Field of Classification Search ................ 365/203, 365/190, 154, 104
See application file for complete search history.

(56) References Cited

U.S. PATENT DOCUMENTS

| | | | |
|---|---|---|---|
| 4,758,745 A | 7/1988 | Elgamal et al. ............. 307/465 |
| 4,870,302 A | 9/1989 | Freeman ..................... 307/465 |
| 4,899,205 A | 2/1990 | Hamdy et al. ................ 357/51 |
| 4,996,697 A * | 2/1991 | Critchlow et al. .......... 375/351 |
| 5,194,759 A | 3/1993 | El-Ayal et al. ........... 307/202.1 |
| 5,222,066 A | 6/1993 | Grula et al. ................ 371/21.1 |
| 5,272,101 A | 12/1993 | Forouhi et al. ............... 437/50 |
| 5,299,152 A | 3/1994 | Ishihara et al. ............... 365/96 |
| 5,311,080 A | 5/1994 | Britton et al. .............. 307/465 |
| 5,327,024 A | 7/1994 | Cox ........................... 307/465 |
| 5,371,422 A | 12/1994 | Patel et al. .................... 326/41 |
| 5,379,261 A * | 1/1995 | Jones, Jr. ............... 365/230.01 |
| 5,455,525 A | 10/1995 | Ho et al. ....................... 326/41 |
| 5,469,003 A | 11/1995 | Kean ............................. 326/39 |
| 5,490,074 A | 2/1996 | Agrawal et al. ............. 364/489 |
| 5,495,181 A | 2/1996 | Kolze .......................... 326/38 |
| 5,502,655 A * | 3/1996 | McClure ..................... 702/127 |
| 5,504,703 A | 4/1996 | Bansal ........................ 365/156 |
| 5,509,128 A | 4/1996 | Chan .......................... 395/311 |
| 5,525,923 A | 6/1996 | Bialas, Jr. et al. .......... 327/210 |
| 5,537,057 A | 7/1996 | Leong et al. .................. 326/41 |
| 5,598,109 A | 1/1997 | Leong et al. .................. 326/41 |
| 5,611,042 A | 3/1997 | Lordi .................... 395/182.04 |
| 5,648,913 A | 7/1997 | Bennett et al. ............. 364/491 |
| 5,666,322 A | 9/1997 | Conkle ....................... 365/233 |

(Continued)

FOREIGN PATENT DOCUMENTS

EP   1 137 188 A2   9/2001

(Continued)

OTHER PUBLICATIONS

L. Ashby, "ASIC Clock Distribution Using A Phase Locked Loop (PLL)", *Proceedings Fourth Annual IEEE International ASIC Conference and Exhibit*, pp. P1-6.1-P1.6.3, Sep. 23-27, 1991.

(Continued)

*Primary Examiner*—Thong Q. Le
(74) *Attorney, Agent, or Firm*—Sierra Patent Group, Ltd.

(57) ABSTRACT

The present invention comprises a device and a method for a deglitching circuit for a radiation tolerant static random access memory (SRAM) based field programmable gate array. The deglitching circuit for a radiation tolerant static random access memory (SRAM) based field programmable gate array comprises a configuration memory that has a plurality of configuration bits Read and write circuitry is provided to configure the plurality of configuration bits. A radiation hard latch is coupled to and controls a programmable element and an interface couples at least one of the plurality of configuration bits to the radiation hard latch when the write circuitry writes to the plurality of configuration bits.

10 Claims, 7 Drawing Sheets

U.S. PATENT DOCUMENTS

| | | | |
|---|---|---|---|
| 5,671,432 A | 9/1997 | Bertolet et al. | 395/800 |
| 5,744,979 A | 4/1998 | Goetting | 326/39 |
| 5,744,980 A | 4/1998 | McGowan et al. | 326/40 |
| 5,761,140 A | 6/1998 | Choi | 365/201 |
| 5,815,004 A | 9/1998 | Trimberger et al. | 326/41 |
| 5,850,564 A | 12/1998 | Ting et al. | 395/800.37 |
| 5,894,228 A | 4/1999 | Reddy et al. | 326/39 |
| 5,942,914 A | 8/1999 | Reddy et al. | 326/41 |
| 5,966,027 A | 10/1999 | Kapusta et al. | 326/39 |
| 5,994,934 A | 11/1999 | Yoshimura et al. | 327/158 |
| 6,005,410 A | 12/1999 | Laramie | 326/39 |
| 6,038,627 A | 3/2000 | Plants | 710/126 |
| 6,043,677 A | 3/2000 | Albu et al. | 326/39 |
| 6,049,225 A | 4/2000 | Huang et al. | 326/41 |
| 6,107,822 A | 8/2000 | Mendel et al. | 326/39 |
| 6,111,448 A | 8/2000 | Shibayama | 327/293 |
| 6,121,346 A * | 9/2000 | Visel et al. | 523/200 |
| 6,130,551 A | 10/2000 | Agrawal et al. | 326/39 |
| 6,150,837 A | 11/2000 | Beal et al. | 326/39 |
| 6,150,841 A | 11/2000 | Agrawal et al. | 326/41 |
| 6,150,868 A | 11/2000 | Kim et al. | 327/525 |
| 6,181,174 B1 | 1/2001 | Fujieda et al. | 327/158 |
| 6,205,533 B1 | 3/2001 | Margolus | 712/13 |
| 6,237,124 B1 | 5/2001 | Plants | 714/763 |
| 6,268,743 B1 | 7/2001 | Kaptanoglu | 326/40 |
| 6,286,093 B1 | 9/2001 | Chang et al. | 712/11 |
| 6,289,068 B1 | 9/2001 | Hassoun et al. | 375/376 |
| 6,289,494 B1 | 9/2001 | Sample et al. | 716/12 |
| 6,292,016 B1 | 9/2001 | Jefferson et al. | 326/39 |
| 6,300,793 B1 | 10/2001 | Ting et al. | 326/41 |
| 6,333,666 B2 | 12/2001 | Kim et al. | 327/525 |
| 6,338,106 B1 | 1/2002 | Vorbach et al. | 710/100 |
| 6,437,650 B1 | 8/2002 | Sung et al. | 331/25 |
| 6,567,968 B1 | 5/2003 | Kaptanoglu | 716/16 |
| 6,570,798 B1 | 5/2003 | McCollum | 365/201 |
| 6,570,805 B2 | 5/2003 | McCollum | 365/225.7 |
| 6,636,930 B1 | 10/2003 | Kaptanoglu | 710/316 |

FOREIGN PATENT DOCUMENTS

| | | |
|---|---|---|
| EP | 1 137 188 A3 | 8/2003 |

OTHER PUBLICATIONS

"AV9170 Clock Synchronizer and Multiplier", originally owned by AvaSem Corp, dated Nov. 1992, update version AV9170, Integrated Circuit Systems, Inc., pp. 1-11, Rev E Sep. 24, 1999, Sep. 1999.

"AV9170 Application Note-Clock Synchronizer and Multiplier", Integrated Circuit Systems, Inc. former AvaSem Corp., pp. 1-7, originally dated Jan. 1993, revision 9170ApRev111694, no date on publication.

U. Ko et al., "A 30-ps JITTER, 3.6 µs Locking, 3.3-Volt Digital PLL For CMOS Gate Arrays", *IEEE 1993 Custom Integrated Circuits Conference*, pp. 23.3.1-23.3.4, Conf. Date: May 9-12, 1993.

A. Efendovich, et al. "Multi-frequency Zero-Jitter Delay-Locked Loop", *IEEE 1993 Custom Integrated Circuits Conference*, pp. 27.1.1-27.1.4, Conf. Date: May 9-12, 1993.

R. Quinnell, Technical Ed., "Blending gate arrays with dedicated circuits sweetens ASIC development", *EDN*, pp. 29-32, Mar. 31, 1994.

J. R. Schwank, Section II, "Basic Mechanisms of Radiation Effects in the Natural Space Environment" in "Radiation Effect in Commercial Electronics", *IEEE Nuclear and Space Radiation Effects Conference Short Course*, pp. II-1 to II-87, Westin La Paloma Resort, Tuscon, Arizona, Jul. 18, 1994.

N. Haddad et al., Chapter IV, "Adapting Commercial Electroincis to the Naturally Occurring Radiation Environment" in Radiation Effect in Commercial Electronics, *IEEE Nuclear and Space Radiation Effects Conference Short Course*, pp. IV-20 to IV-25, Westin La Paloma Resort, Tuscon, Arizona, Jul. 18, 1994.

J. Chen, "PLL-based clock systems span the system spectrum from green PCs to Alpha", *EDN*, pp. 147-155, Nov. 9, 1995.

P. Sevalia, "Straightforward techniques cut jitter in PLL-based clock drivers", *EDN*, pp. 119-125, Nov. 23, 1995.

D. Bursky, "Memories Hit New Highs and Clocks Run Jitter-Free", *Electronic Design*, pp. 79-93, Feb. 19, 1996.

G. Messenger et al., Chapter 2, "Extraterrestrial SEU-Inducing Particles", *Single Event Phenomena*, pp. 23-35, 74-85, Chapman & Hall a division of International Thomson Publishing, 1997.

Y. Lia et al., "Hierarchical Interconnection Structures For Field Programmable Gate Arrays", IEEE Transactions on Very Large Scale (VLSI) Interaction Systems, vol. 5, No. 2, pp. 186-196, Jun. 1997.

* cited by examiner

DEGLITCHING CIRCUITS FOR A RADIATION-HARDENED STATIC RANDOM ACCESS MEMORY BASED PROGRAMMABLE ARCHITECTURE

BACKGROUND

1. Field of the Invention

The present invention relates to a method for designing radiation-hardened programmable devicse such as Field Programmable Gate Arrays (FPGA). More specifically, the present invention relates to circuit designs for a radiation-hardened static random access memory (SRAM) based programmable device.

2. Background

A major concern in building a radiation-hardened SRAM based programmable device such as a FPGA or programmable logic device (PLD) for a space application is the reliability of the configuration memory. Memory devices used in satellites and in other computer equipment, can be placed in environments that are highly susceptible to radiation. A satellite memory cell in a space environment can be exposed to a radiation-induced soft error, commonly called a single event upset (SEU), when a cell is struck by high-energy particles. Electron-hole pairs are created by, and along the path of, a single energetic particle as it passes through an integrated circuit. An SEU typically results from alpha particles (helium nuclei), beta particles or other ionized nuclei impacting a low-capacitance node of a semiconductor circuit. Should the energetic particle generate the critical charge in the critical volume of the memory cell, the logic state of the memory is upset. This critical charge, by definition, is the minimum amount of electrical charge required to change the logic state of the memory cell. It is commonly called Q-Critical ($Q_{crit}$).

SEU can change the contents of any volatile memory cell. If that bit of memory is doing something besides merely storing data, such as controlling the logic functionality of an FPGA, or other SRAM-based programmable device the results can be catastrophic. While other technologies may be better suited for the most sensitive control functions of a spacecraft, there is a significant advantage to be had by being able to change a portion of the spacecraft's functionality remotely, either during prototyping on the ground or later during the mission. Spacecraft designers accept the idea that SEUs will inevitably occur. Based on the inevitable, such designers are willing to use SRAM based FPGAs and other programmable devices in non-critical portions of the vehicle provided that the error rate is reasonable, sufficient error trapping is available and the recovery time is reasonable.

When an ion traverses a node within a memory storage cell, the ion can force the node from its original state to an opposite state for a period of time. This change of state is due to the charge that the heavy ion deposits as it passes through the silicon of the metal oxide semiconductor (MOS) transistor of the memory cell. If this node is held in the opposite state for a period of time longer than the delay around the feed back loop of the memory cell, the cell can switch states and the stored data can be lost. The period of time the node is held in the opposite state can depend on several factors, the most critical being the charge deposited.

FIG. 1a is a simplified schematic diagram of a logic gate 104. Logic gate 104 comprises a p-channel transistor 102 and an n-channel transistor 100. P-channel transistor 102 has a source coupled to Vcc, a drain coupled to node Q 105, a gate coupled to node QB 106 and a substrate connected to Vcc. N-channel transistor 100 has a source 165 coupled to ground, a drain 160 coupled to Q node 105, a gate 162 coupled to QB node 106 and a substrate connection 190 also coupled to ground.

FIG. 1b is an illustration of a charged particle strike on a cross-section diagram of transistor 100. Transistor 100 comprises a drain 160, a source 165 and a gate 162. Gate oxide 163 separates gate 162 from drain 160, source 161 and substrate 190. As shown in FIG. 1b, the drain 160 is being struck by the charged particle (ion) 110 along the strike path 180. When the charged particle 110 passes though a semiconductor transistor 100 (potentially at relative velocities of 10,000 miles per hour or more), it ionizes atoms in the silicon leaving a wake of hole and electron pairs 120 behind. If it strikes the output diffusion of a complementary metal oxide semiconductor (CMOS) logic gate 104, as illustrated in FIG. 1a, all of those charge carriers are available as drift current 130 along strike path 180 if an electric field is present. If no electric field is present then the drift current 130 ultimately diffuses. If the output of the CMOS gate is not at the voltage of the surrounding material of the diffusion that is struck (for example, if N+ diffusion 160 is at Vcc and P-substrate 190 is at ground), then such an electric field exists and the current will pull diffusion 160 towards the voltage of the P-substrate 190 or ground.

In such an occurrence, there are two sources of current vying for control of the node Q: the CMOS p-channel device 102 (shown in FIG. 1a) that originally drove the node to the correct logic level and the pool of charge in the so-called "field funnel" 150 supplying drift current 130 in FIG. 1b. The larger current controls the node. If the strength of p-channel device 102 is large relative to the available drift current 130, then the node will barely move. If the strength of p-channel device 102 is small relative to the energy strike, then the drift current 130 in FIG. 1b controls and the node will move rapidly towards ground. When drift current 130 controls, it does so until all its charge dissipates, at which time the CMOS p-channel device 102 can restore the node to the correct value.

Unfortunately, it takes time for a small CMOS device to regain control against a high-energy strike. In the case, for example, of a victimized gate being part of the feedback path in a sequential (i.e. memory) element with the incorrect logic level propagating around the loop, the CMOS device gets shut off and is never able to make the needed correction and the memory element loses state. If the memory element controls something important, system or subsystem failure can result.

FIG. 2a is a simplified schematic diagram illustrating a particle strike on cross-coupled transistors. Transistors 102a, 102b, 100a and 100b form two logic gates like the logic gate 104 in FIG. 1a. In FIG. 2a, particle strike 210 is shown hitting the N+ region of n-channel transistor 100a. FIG. 2b illustrates the waveforms associated with this strike.

FIG. 2b is a diagram depicting the voltage waveforms 200 associated with a particle strike 210. The particular case shown is for a particle not quite capable of producing the critical charge required to flip the latch. At time T1, the particle hits and then node Q drops from its equilibrium value of Vcc very quickly due to the drift current in the field funnel 150 and QB rises due to the drop of Q. Meanwhile, transistor 102 pumps current into node Q slowing its fall. At T2, when all the charge in the field funnel 150 in FIG. 1b is exhausted, node Q quickly returns to its original equilibrium value of Vcc. Since the case depicted is close to the maximum amount of charge that the cell can withstand, the voltage on node Q approaches the trip point 230 at $V_{trip}$. If the charged particle had created substantially more charge carriers than the transistor could have overcome, then node Q would have dropped to ground potential and QB would have risen to Vcc potential, and the latch would have flipped into the opposite state permanently.

SRAM in an FPGA may also be specified as CSRAM or USRAM. CSRAM is Configuration SRAM. This CSRAM is used to hold the configuration bits for the FPGA. It is physically spread out over the entire die and is interspersed with the rest of the FPGA circuitry. At least one of the two nodes in the static latch that make up the SRAM cell can be connected to the FPGA circuitry that controls it. When the contents of the CSRAM change, the logic function implemented by the FPGA changes. What is needed is a solution to insure the data integrity is maintained.

USRAM is the abbreviation for user SRAM. This is memory that is part of a user logic design and is concentrated inside a functional block dedicated to the purpose. What is needed is a solution to insure the data integrity of an USRAM is maintained.

In an SRAM based FPGA, there are a variety of separate elements that go into the making of a useful product. There are configuration memory bits in the CSRAM, which allow the user to impose his/her design on the uncommitted resources available. There are the combinational and sequential modules that do the user's logic. There are the configurable switches, signal lines, and buffers that allow the modules to be connected together. There are support circuits like clocks and other global signals like enables and resets, which allow the building of one or more subsystems in different time domains. There are blocks like the SRAM and DLL that allow the user access to more highly integrated functions than can be built out of an array of logic modules and interconnect.

Making each element radiation hardened is not practical due to area consideration since radiation hardened circuits tend to be rather large compared to non-radiation hardened circuits. What is needed is a prioritization of essential circuits to be hardened. Also, what is needed is a reliable radiation hardened FPGA that has a reasonable area that can be produced at a reasonable cost.

Moreover, what is needed is a way of providing a radiation-hardened SRAM based FPGA, which can easily be implemented using conventional CMOS processes, and which has performance and speed comparable to an SRAM based FPGA that has not been radiation-hardened.

SUMMARY OF THE INVENTION

The present invention comprises a device and a method for a deglitching circuit for a radiation tolerant static random access memory (SRAM) based programmable device such as a field programmable gate array. A deglitching circuit for a radiation tolerant static random access memory (SRAM) based field programmable gate array comprises a configuration memory that has a plurality of configuration bits. The configuration bits contain programming information. Read and write circuitry is provided to configure the plurality of configuration bits. A radiation hard latch is coupled to and controls at least one programmable element and an interface couples at least one of the plurality of configuration bits to the radiation hard latch and transmits the programming information in the configuration bits to the radiation hard latch when the read/write circuitry writes and/or reads to the plurality of configuration bits.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

The preferred embodiment of the invention is discussed in detail below. While specific implementations are discussed, it should be understood that this is done for illustration purposes only. A person skilled in the relevant art will recognize that other components and configurations may be used without parting from the spirit and scope of the invention.

The disclosed invention relates to a method for designing a radiation-hardened FPGA and the required circuit designs for conversion from a commercial Static Random Access Memory (SRAM) based Field Programmable Gate Array (FPGA) to a radiation-hardened version. The radiation-hardened FPGA described herein greatly reduces the (Single Event Upset) SEU issues associated with prior-art devices. More specifically, an FPGA is programmed using configuration bits that can be glitched by charged particles. A circuit like a radiation-hard hard latch that cannot be glitched directly controls the control nodes that must be glitch free. An interface between the source of the control bits and the control nodes allows the control bit to indirectly control the control nodes but with the freedom to remain in the wrong state indefinitely due to a particle strike.

Figure 1A:
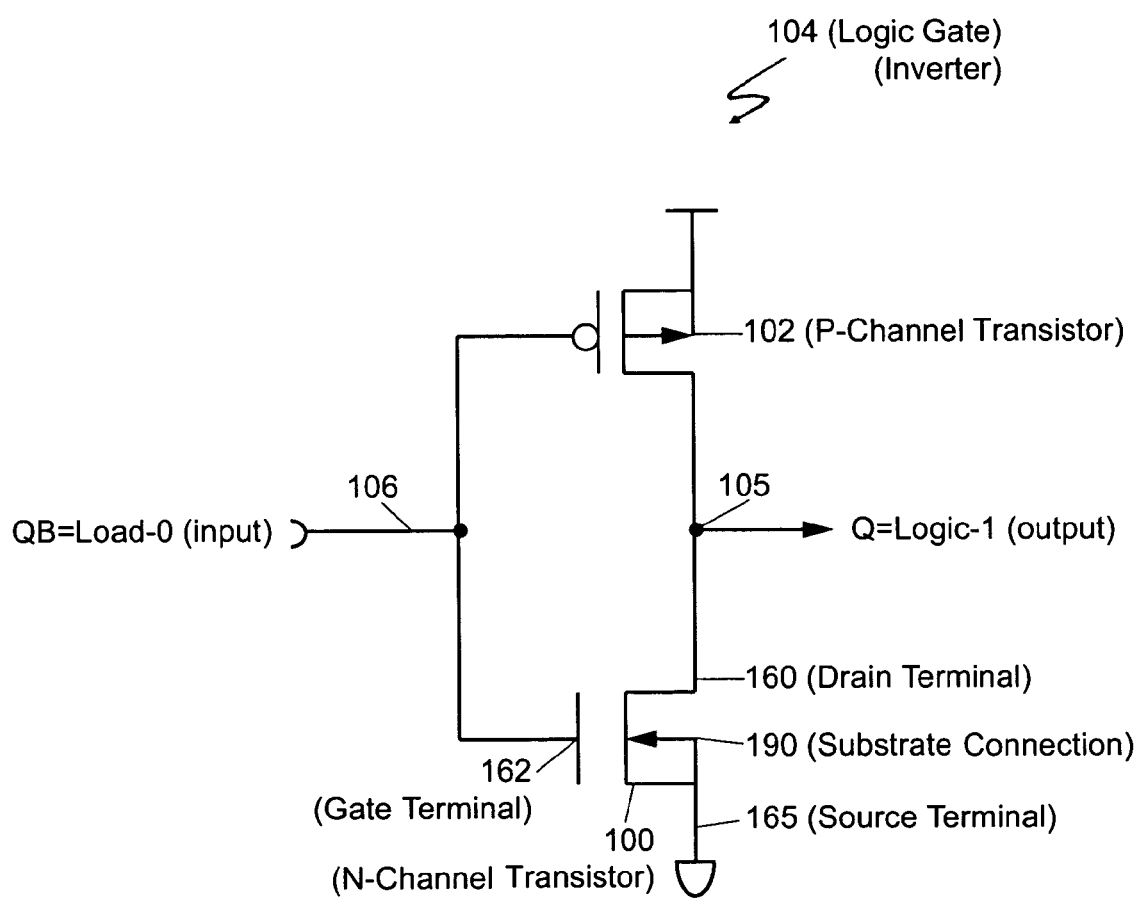
FIG. 1a is a simplified schematic diagram of a logic gate.
Figure 1B:
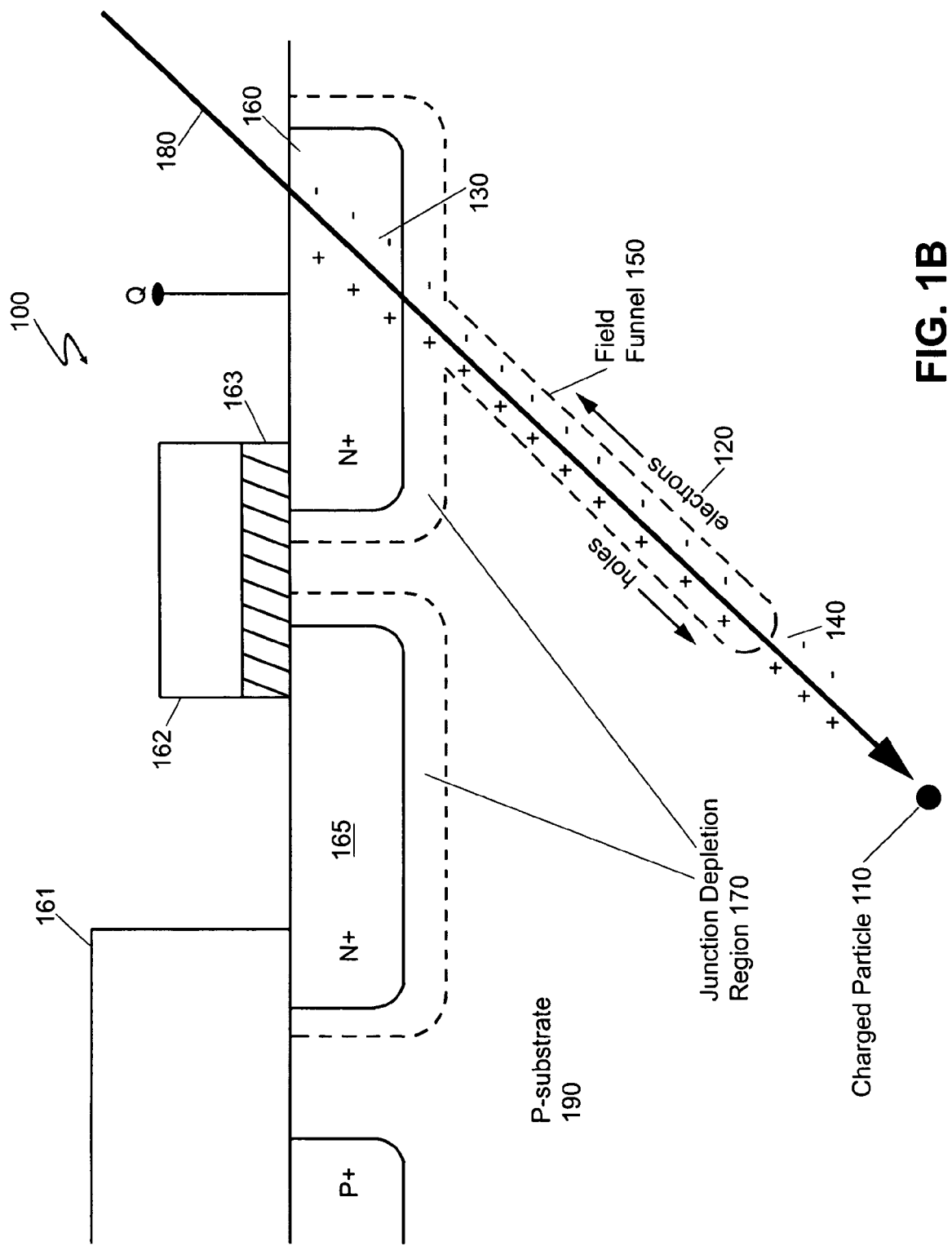
FIG. 1b is an illustration of a charged particle strike though a semiconductor creating a wake of hole and electron pairs.
Figure 2A:
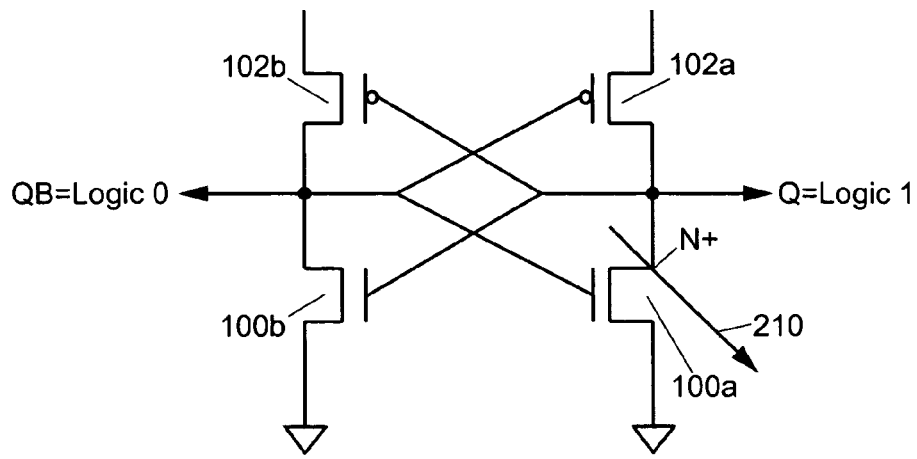
FIG. 2a is a simplified schematic diagram illustrating a particle strike on cross-coupled logic gates.
Figure 2B:
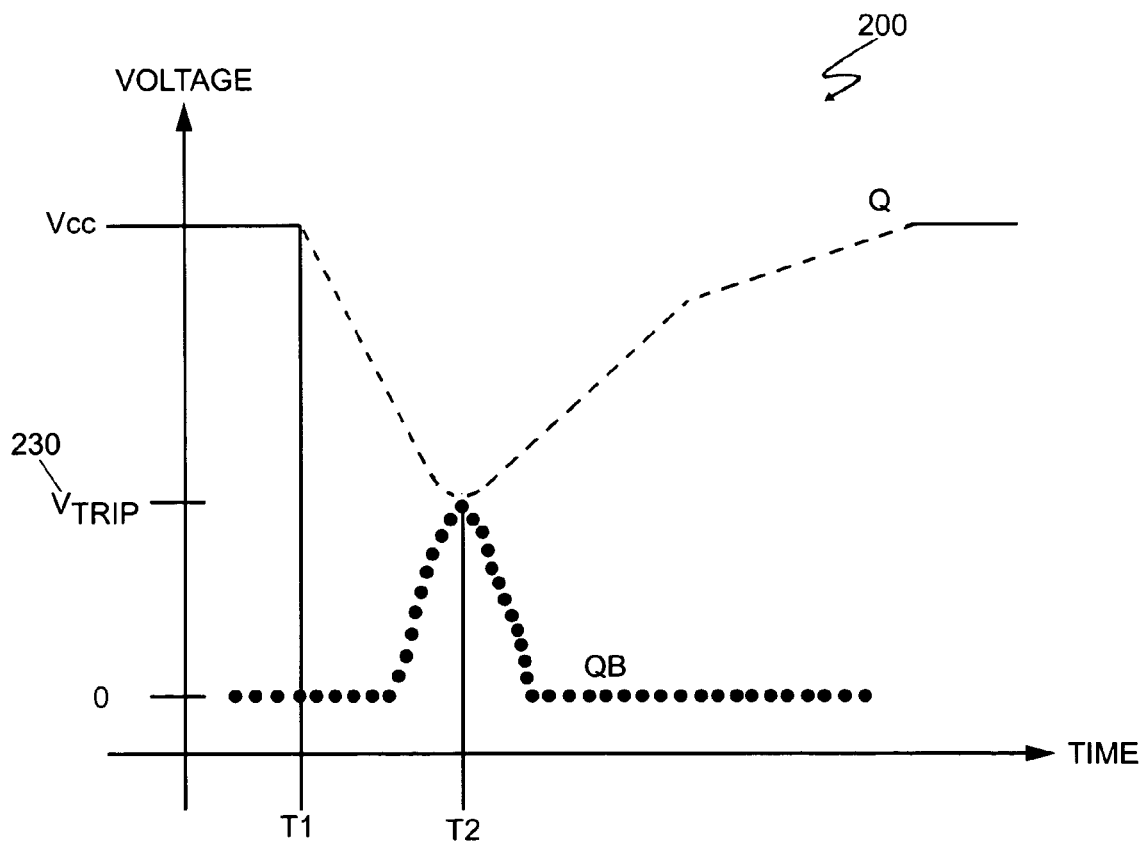
FIG. 2b is the waveform associated with a particle not quite capable of producing the critical charge required to flip a latch.
Figure 3:
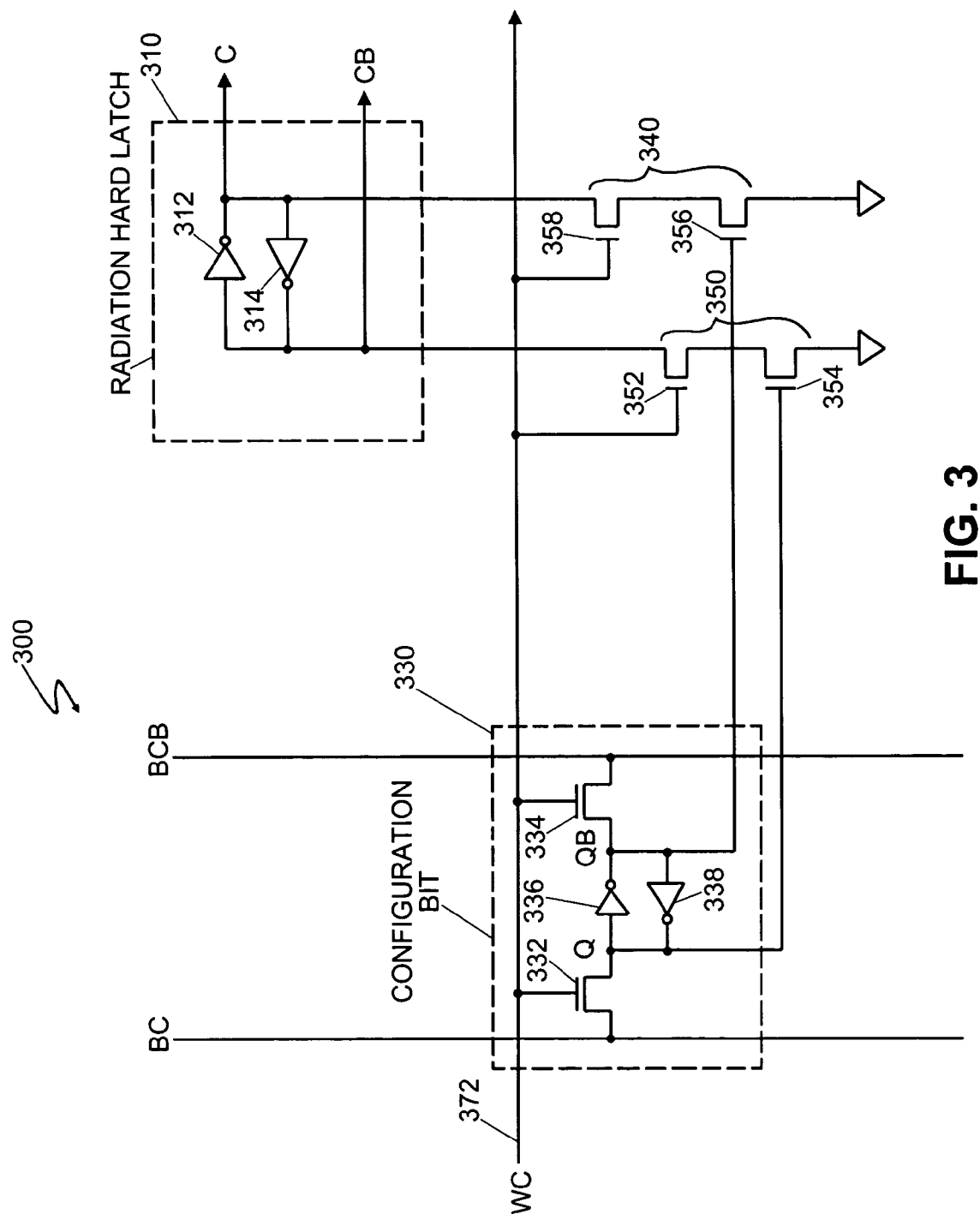
FIG. 3 is a simplified schematic diagram of a memory cell deglitching circuit.

FIG. 3 is a simplified schematic diagram of an embodiment of a memory cell deglitching circuit 300. Memory cell deglitch circuit 300 consists of a radiation-hard (RH) latch 310 and a memory cell 330. First latch 310 is formed from inverters 312 and 314 having a non-inverted output C and an inverted output CB. The RH latch containing C and CB provides for maximum glitch protection, since the transistors are large enough to absorb $Q_{crit}$ from a particle strike without significant perturbation of the voltages on C and CB.

A memory cell 330 has a non-inverted output Q connected to latch 310 through control gate 354 of NAND stack 350. NAND stack 350 has a second control gate 352 coupled to wordline 372. Memory cell 330 has an inverted output QB connected to latch 310 through control gate 356 of NAND stack 340. NAND stack 340 has a second control gate 358 coupled to wordline 372. Memory cell deglitch circuit 300 has wordline input WL 372 coupled to the control gates of pass transistors 332 and 334 in memory cell 330. Memory cell 330 may be of a type that is well known to those of ordinary skill in the art and may comprise, for example, two inverters 336 and 338 each having an input coupled to the output of the other inverter either directly as shown in the figure or through high-resistance polysilicon resistors, e.g., about at least several hundred kilo-ohms (not shown) as is known in the art. When the wordline 372 is high, data can be written into memory cell 330 which forces the state of Q and QB into C and CB.

Inverters 312 and 314 of latch 310 are large enough to absorb Q critical from an ion charged particle strike. As one of ordinary skill in the art having the benefit of this disclosure will appreciate, the size of the transistors in inverters 312 and 314 will vary. The size of transistors in inverters 312 and 314 are functions of the process used and are designed to be large enough to absorb a $Q_{crit}$ particle strike without a significant change in voltage. Memory cell 330 outputs Q and QB are as vulnerable as any CSRAM bit. However, because the transistors inside latch 310 are big enough to absorb the highest energy particle strike being designed for, then memory cell 330 can go unresolved or uncorrected indefinitely and the rest of the circuit will never be affected.

First latch 310 is formed from MOS transistors of a size larger than that of the minimum-sized transistor for the process technology employed, wherein the P-channel drive strength is approximately double the N-channel drive strength and is of a sufficient size to absorb an ionizing radiation particle. In a 0.25 micron CMOS process, the P-channel width-to-length (W/L) ratio is about approximately 30/0.24 micrometer and the N-channel W/L ratio is approximately 15/0.24 micrometer. For an illustrative 0.25 um process in question, the minimum-sized transistors are about 0.64/0.24 and 0.30/0.24 um respectively. That means that the 30.00/0.24 um P-channel transistor is about 47× the size of the minimum transistor and the 15.00/0.24 um N-channel transistor is about 23× the size of the minimum transistor, assuming a standard layout is used.

Figure 4:
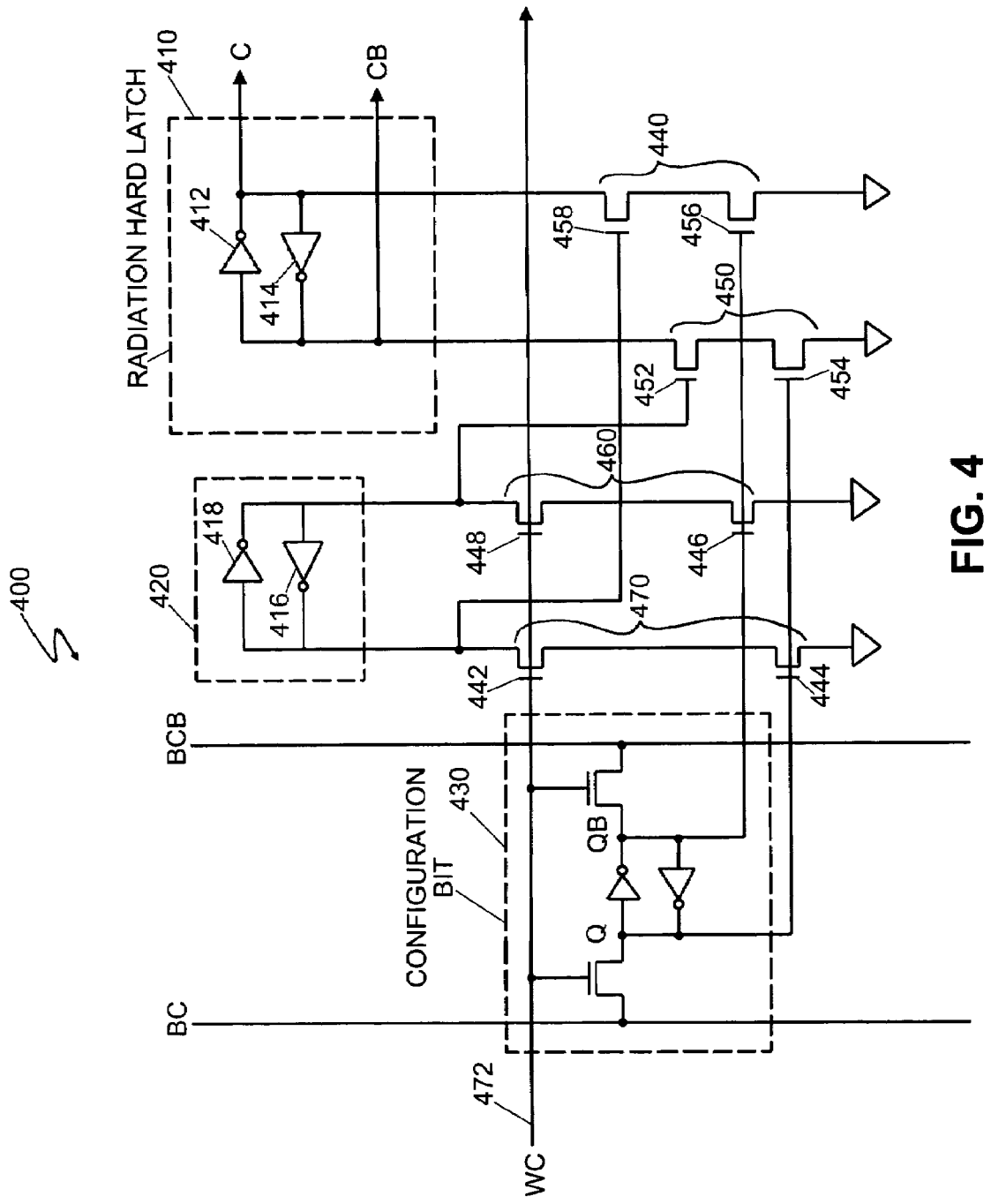
FIG. 4 is a simplified schematic diagram of a second embodiment of a memory cell deglitching circuit.

FIG. 4 is a simplified schematic diagram of another embodiment of a memory cell deglitching circuit. Memory cell deglitch circuit 400 consists of RH latch 410, latch 420, and a memory cell 430 connected together. RT latch 410 is formed from inverters 412 and 414 having a non-inverted output C and an inverted output CB. The RT latch containing C and CB provides for maximum glitch protection. A second latch 420 is formed from cross-coupled inverters 416 and 418. Inverter 416 of second latch 420 has an inverted output AB coupled to gate 458 of NAND stack 440 of first latch 410. Inverter 418 of second latch 420 has an output A coupled to control gate 452 of NAND stack 450 of first latch 410. A memory cell 430 has a non-inverted output Q connected to RT latch 410 through NAND stack 450 and connected to latch 420 through NAND stack 470. Memory cell 430 has an inverted output QB connected to RT latch 410 through NAND stack 440 and latch 420 through NAND stack 460. Memory cell deglitch circuit 400 has wordline input 472 coupled to memory cell 430, latch 420 through NAND stack 470 and latch 420 through NAND stack 460. When the wordline 472 is high, data can be written into memory cell 430 and which Q and QB force the same states into A and AB as well. Q and QB and A and AB then force the same logic state into C/CB.

In the configuration of the memory cell deglitch circuit 400, memory cell 430 and latch 420 must be a minimum of the double strike distance apart. First latch 410 outputs C and CB are resistant to an ion charged particle strike. The first latch 410 transistors 412 and 414 are large enough to absorb Q critical from an ion charged particle strike. Latch 420 outputs A and AB and the memory cell 430 outputs Q and QB individually are as vulnerable as any CSRAM bit. However, because they are more than the minimum double strike distance apart, no single particle strike can disturb both. If they are in opposite states (that is second latch 420 and memory cell 430 have opposite output states), the two NAND stacks 440 and 450 present high impedance to C and CB leaving it isolated. The minimum strike distance (MSD) is a function of the physical properties of the device such that a single particle with a shallow angle of approach cannot affect two circuits spaced apart more than the MSD. Thus, the state at C and CB will be held in place indefinitely until a write operation. Note, if the transistors not inside memory cell 430 are big enough to absorb the highest energy particle strike being designed for, then memory cell 430 can go unresolved or uncorrected indefinitely and the rest of the circuit will never be affected. If A and AB flip, the correct data will be written back the next time memory cell 430 is accessed (read or write). The odds against a second particle flipping Q and QB or A and AB while waiting for a refresh are extremely low.

RH latch 410 is formed from MOS transistors of a larger size wherein the P-channel drive strength is double the N-channel drive strength and is of a sufficient size to absorb the charge generated by an ionizing radiation particle. In a 0.25 n CMOS process, the P-channel W/L ratio is about approximately 30/0.24 micrometer and the N-channel W/L ratio is about approximately 15/0.24 micrometer. The above sizes are an illustrative example only and are in no way meant to limit the present disclosure.

Figure 5:
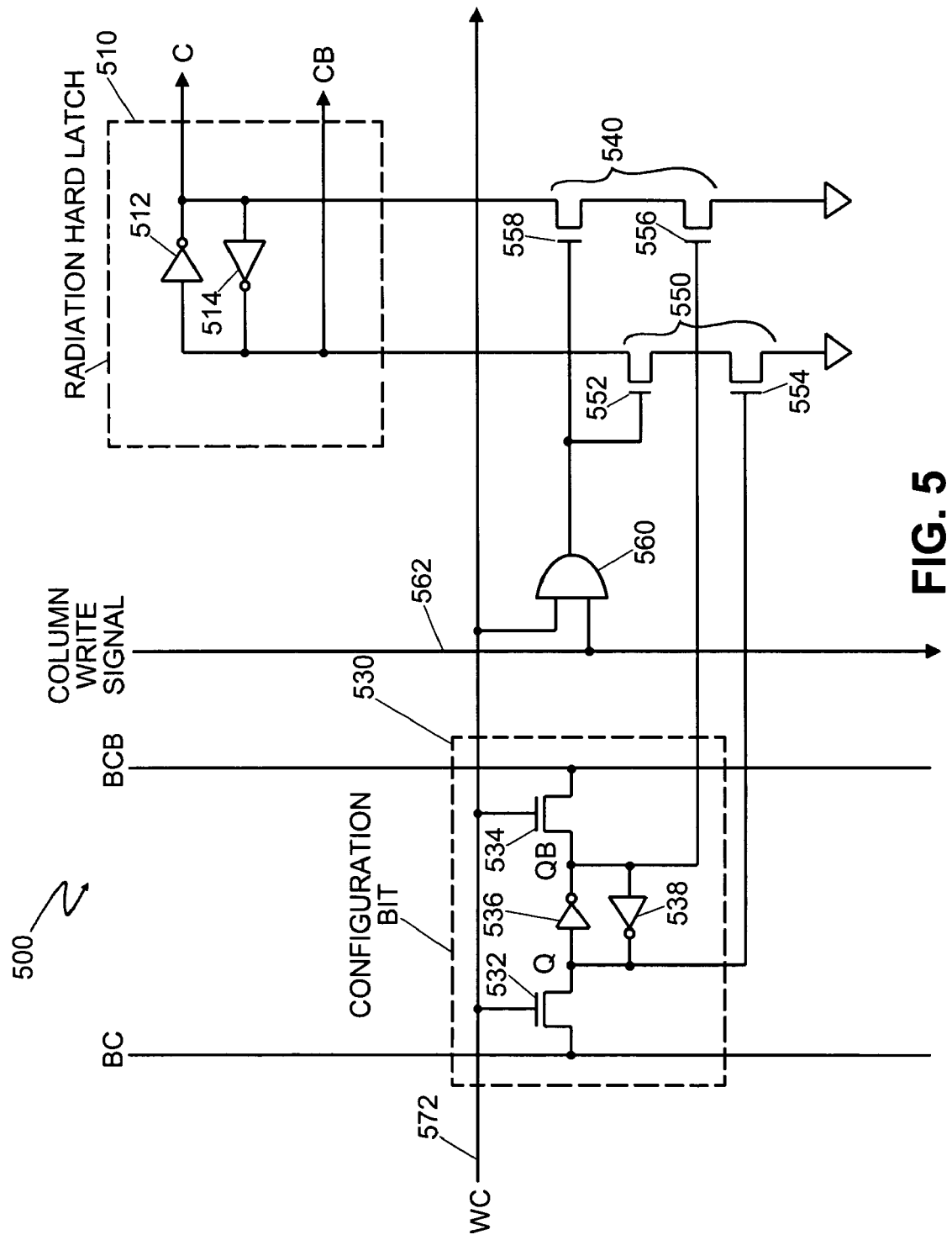
FIG. 5 is a simplified schematic diagram of a third embodiment of a memory cell deglitching circuit.

FIG. 5 is a simplified schematic diagram of yet another embodiment of a memory cell deglitching circuit 500. Memory cell deglitch circuit 500 consists of RH latch 510 and memory cell 530. First latch 510 is formed from inverters 512 and 514 having a non-inverted output C and an inverted output CB. The full-latch containing C and CB provides for maximum glitch protection.

A memory cell 530 has a non-inverted output Q connected to RH latch 510 through control gate 554 of NAND stack 550. NAND stack 550 has a second control gate 552 coupled to wordline 572 and the column write signal through AND gate 560. Memory cell 530 has an inverted output QB connected to RH latch 510 through control gate 556 of NAND stack 540. NAND stack 540 has a second control gate 558 coupled to wordline 572 and the column write signal through AND gate 560. Memory cell deglitch circuit 500 has wordline input WL 572 coupled to the control gates of pass transistors 532 and 534 in memory cell 530. Memory cell 530 is well known to those of ordinary skill in the art and comprises two inverters 536 and 538 each having an input coupled to the output of the other inverter. When the wordline 572 is high, data can be written into or read from memory cell 530.

In the present embodiment, a column write signal 562 is added to memory deglitch circuit 500. As stated above, NAND stack 550 has a second control gate 552 coupled to wordline 572 and global write signal through AND gate 560 and NAND stack 540 has a second control gate 558 coupled to wordline 572 and global write signal through AND gate 560. Coupling RT latch 510 through AND gate 560 isolates latch 510 and outputs C and CB from outputs Q and QB during read operations without affecting the state of C and CB.

The RT latch 510 inverters 512 and 514, as set forth above in relation to FIGS. 3 and 4, have transistors large enough to absorb Q critical from an ion charged particle strike. Memory cell 530 outputs Q and QB are as vulnerable as any CSRAM bit. However, since C/CB are isolated from Q/QB an SEU of Q/QB will not upset C/CB.

Figure 6:
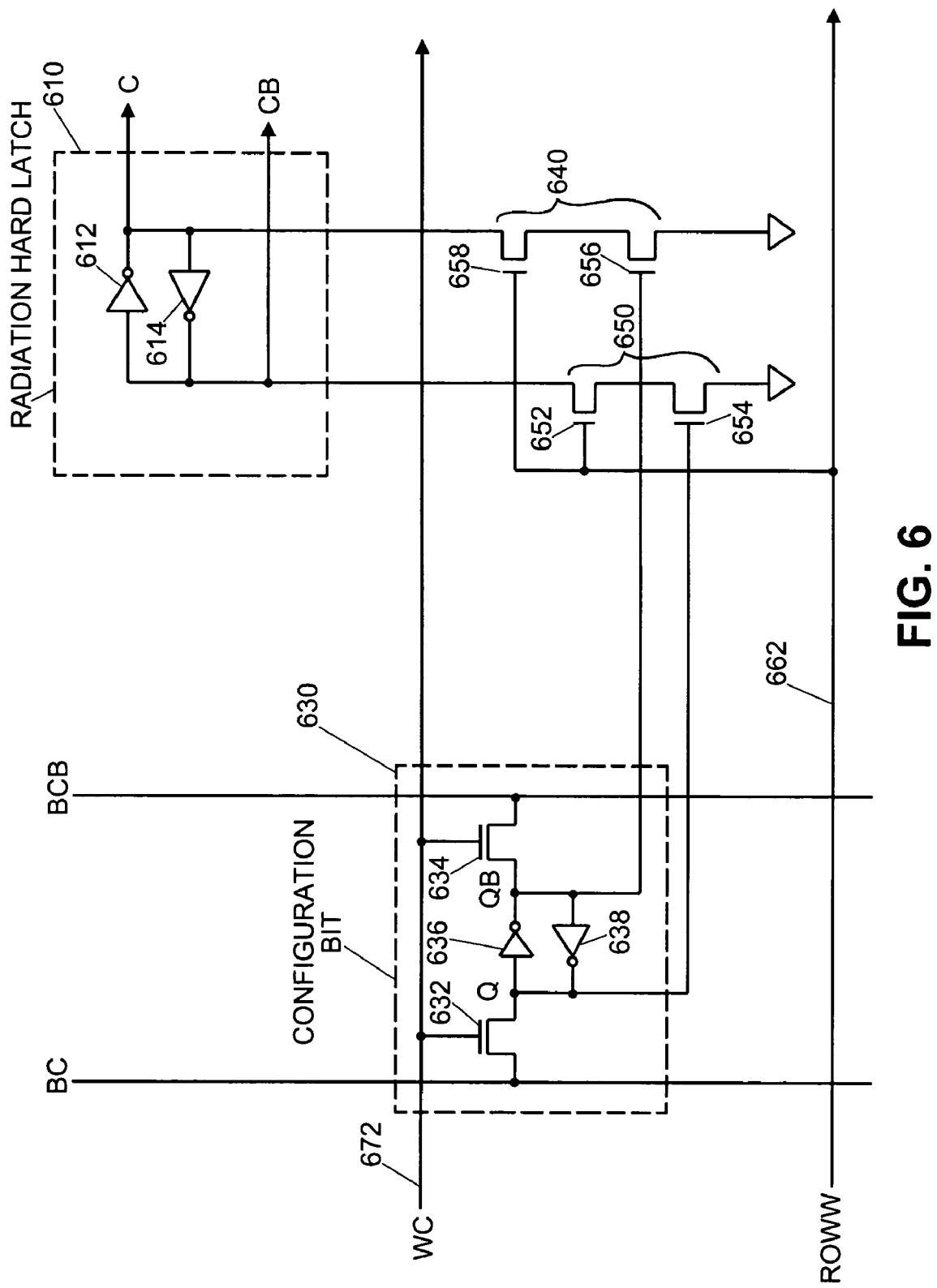
FIG. 6 is a simplified schematic diagram of a fourth embodiment of a memory cell deglitching circuit.

FIG. 6 is a simplified schematic diagram of still yet another embodiment of a memory cell deglitching circuit 600. Memory cell deglitching circuit 600 is substantially similar to memory cell deglitching circuit 500 as set forth in FIG. 5 except that in the present embodiment, a row write line 662 is added to memory deglitch circuit 600 instead of the column write signal as in memory cell deglitching circuit 500. As stated above, NAND stack 650 has a second control gate 652 coupled to row write signal line 662 and NAND stack 640 has a second control gate 658 coupled to row write signal line 662. Coupling latch 610 to global row write signal line isolates latch 510 and outputs C and CB from outputs Q and QB without affecting the state of C and CB, except during write operations.

While the present disclosure is made in the context of an FPGA device, persons of ordinary skill in the art will appreciate that the present invention is applicable to other SRAM-based programmable devices. While embodiments and applications of this invention have been shown and described, it would be apparent to those skilled in the art that many more modifications than mentioned before are possible without departing from the inventive concepts herein. The invention, therefore, is not to be restricted except in the spirit of the appended claims.

What is claimed is:

1. A deglitching circuit for a radiation tolerant static random access memory (SRAM) comprising:
a configuration memory having a plurality of configuration bits;
read and write circuitry coupled to said configuration memory to configure said plurality of configuration bits;
a radiation hard latch coupled to and controlling a programmable element, wherein said radiation hard latch comprises a plurality of inverters, the output of a first inverter of said plurality of inverters is coupled to the input of a second inverter of said plurality of inverters and the input of a first inverter is coupled to the output of a second inverter of said plurality of inverters, said plurality of inverters of said radiation hardened latch each comprises a pair of MOS transistors; and
an interface coupling at least one of said plurality of configuration bits to said radiation hard latch when said write circuitry writes to said at least one of said plurality of configuration bits.

2. The deglitching circuit for a radiation tolerant static random access memory according to claim 1 wherein said configuration memory comprises a plurality of inverters, wherein the output of a first of said plurality of inverters is coupled to the input of a second inverter of said plurality of inverters and the input of a first inverter is coupled to the output of a second inverter of said plurality of inverters.

3. The deglitching circuit for a radiation tolerant static random access memory according to claim 1 wherein said pair of P-channel MOS transistors have a W/L ratio of approximately 30/0.24 micrometers.

4. The deglitching circuit for a radiation tolerant static random access memory according to claim 1 wherein said pair of N-channel MOS transistors have a W/L ratio of approximately 15/0.24 micrometers.

5. The deglitching circuit for a radiation tolerant static random access memory according to claim 1 wherein said interface comprises a plurality of sets of gates.

6. A method of deglitching a circuit for a radiation tolerant static random access memory (SRAM) comprising:
providing a configuration memory having a plurality of configuration bits;
coupling read and write circuitry to said configuration memory to configure said plurality of configuration bits;
coupling a radiation hard latch coupled to a programmable element such that said radiation hard latch controls a programmable element, wherein said radiation hard latch comprises a plurality of inverters, the output of a first inverter of said plurality of inverters is coupled to the input of a second inverter of said plurality of inverters and the input of a first inverter is coupled to the output of a second inverter of said plurality of inverters said plurality of inverters of said radiation hardened latch each comprises a pair of MOS transistors; and
coupling an interface to at least one of said plurality of configuration bits to said radiation hard latch when said write circuitry writes to said at least one of said plurality of configuration bits.

7. The method of deglitching a circuit for a radiation tolerant static random access memory according to claim 6 wherein said configuration memory comprises a plurality of inverters, wherein the output of a first of said plurality of inverters is coupled to the input of a second inverter of said plurality of inverters and the input of a first inverter is coupled to the output of a second inverter of said plurality of inverters.

8. The method of deglitching a circuit for a radiation tolerant static random access memory according to claim 6 wherein said pair of P-channel MOS transistors have a W/L ratio of approximately 30/0.24 micrometers.

9. The method of deglitching a circuit for a radiation tolerant static random access memory according to claim 6 wherein said pair of N-channel MOS transistors have a W/L ratio of approximately 15/0.24 micrometers.

10. The method of deglitching a circuit for a radiation tolerant static random access memory according to claim 6 wherein said interface comprises a plurality of sets of gates.

* * * * *